United States Patent
Kanai et al.

(10) Patent No.: US 9,686,894 B2
(45) Date of Patent: Jun. 20, 2017

(54) COMPONENT MOUNTING METHOD USING A TAPE FEEDER

(75) Inventors: Kazunori Kanai, Yamanashi (JP);
Masanori Hiyoshi, Yamanashi (JP);
Shigekazu Yoneyama, Yamanashi (JP);
Satoshi Kawaguchi, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 514 days.

(21) Appl. No.: 14/234,792

(22) PCT Filed: Aug. 16, 2012

(86) PCT No.: PCT/JP2012/005171
§ 371 (c)(1),
(2), (4) Date: Jan. 24, 2014

(87) PCT Pub. No.: WO2013/027375
PCT Pub. Date: Feb. 28, 2013

(65) Prior Publication Data
US 2014/0150256 A1  Jun. 5, 2014

(30) Foreign Application Priority Data
Aug. 25, 2011 (JP) .................... 2011-183266

(51) Int. Cl.
*H05K 13/02* (2006.01)
*H05K 13/04* (2006.01)

(52) U.S. Cl.
CPC ......... *H05K 13/02* (2013.01); *H05K 13/0417* (2013.01); *Y10T 29/4913* (2015.01); *Y10T 29/53174* (2015.01)

(58) Field of Classification Search
CPC H05K 13/02; H05K 13/0417; Y10T 29/4913; Y10T 29/53174
See application file for complete search history.

(56) References Cited

FOREIGN PATENT DOCUMENTS

| CN | 1496220 A | | 5/2004 |
|---|---|---|---|
| CN | 101085646 A | | 12/2007 |
| JP | 5090782 A | * | 4/1993 |
| JP | 5090783 A | * | 4/1993 |
| JP | H0590800 A | * | 4/1993 |
| JP | 08-51293 A | | 2/1996 |

(Continued)

OTHER PUBLICATIONS

International Search Report for Application No. PCT/JP2012/005171 dated Sep. 18, 2012.

(Continued)

*Primary Examiner* — Carl Arbes
(74) *Attorney, Agent, or Firm* — Pearne & Gordon, LLP (57) ABSTRACT

A size S1 of each of projections 32b provided on an outer perimeter of a sprocket 32 in a proceeding direction of a tape member 20 at a height where each of the projections 32b is engaged with each of feed holes 22 of the tape member 20 is larger than a diameter D of each of the feed holes 22 of the tape member 20, and a size S2 of each of the projections 32b in a direction perpendicular to the proceeding direction of the tape member 20 at a height where each of the projections 32b is engaged with each of the feed holes 22 of the tape member 20 is smaller than the diameter D of each of the feed holes 22 of the tape member 20.

4 Claims, 8 Drawing Sheets

(56) References Cited

FOREIGN PATENT DOCUMENTS

| JP | 2003-124686 A | 4/2003 |
| JP | 2007-227491 A | 9/2007 |
| JP | 2010-219132 A | 9/2010 |
| JP | 2012-134218 A | 7/2012 |

OTHER PUBLICATIONS

Office Action for Chinese Application No. 201280037477.6 dated Jul. 20, 2015.

\* cited by examiner

COMPONENT MOUNTING METHOD USING A TAPE FEEDER

TECHNICAL FIELD

The present invention relates to a tape feeder that supplies components, a component mounting apparatus including the tape feeder, and a component mounting method by the component mounting apparatus.

BACKGROUND ART

A component mounting apparatus that mounts components (electronic components) on a substrate includes a substrate positioning unit that performs positioning of the substrate, a component supply unit that supplies components, and a mounting head that picks up the components that are supplied by the component supply unit and mounts the components on the substrate of which positioning is performed by the substrate positioning unit. At this point, a tape feeder that is known as a kind of a component feeder constituting the component supply unit makes a tape member in which components are housed in each of a number of component storage units that are aligned at regular intervals proceed, and supplies the components that are housed in the tape member to a predetermined component ejection slot.

This type of tape feeder includes a feeder main body including a tape passage that is a passage of the tape member, a sprocket that is provided rotatable under the tape member that passes inside the tape passage of the feeder main body and includes a number of projections on its outer perimeter, and sprocket driving means for drivingly rotating the sprocket intermittently and thereby moving each of the projections provided on the outer perimeter of the sprocket on a circular orbit having the rotation axis of the sprocket as its center. At this point, each of the projections provided on the outer perimeter of the sprocket has the shape of spreading toward the bottom in a direction of the rotation axis of the sprocket, and when the sprocket is drivingly rotated intermittently by the sprocket driving means, each of the projections provided on the outer perimeter of the sprocket is inserted into from beneath to be engaged with each of feed holes of the tape member that passes through the tape passage of the feeder main body before and after passing through one region on the circular orbit having the rotation axis of the sprocket as its center (a region at an upper end portion of a normal circular orbit), and leaves the tape member for the beneath of the feed holes after retracting the tape member. Thus, the tape member proceeds inside the tape passage of the feeder main body, and the components that are housed in the component storage units are intermittently supplied in succession to the component ejection slot (e.g., see Patent Document 1).

RELATED ART DOCUMENTS

Patent Document

Patent Document 1: JP-A-2003-124686

SUMMARY OF THE INVENTION

Problems to be Solved by the Invention

However, in the conventional tape feeder described above, the size (diameter) of each of the projections provided on the outer perimeter of the sprocket at a height where each of the projections is engaged with each of the feed holes of the tape member is smaller than the diameter of each of the feed holes of the tape member, so that clearance is created between the feed holes of the tape member and the projections of the sprocket that are engaged with the feed holes, which sometimes causes an error between a position of a targeted component ejection slot and a position of a component that is actually supplied to the targeted component ejection slot. While this kind of error appears as a positional deviation (an adsorption deviation) between a component and an adsorption nozzle that picks up the component by adsorption, such an adsorption deviation is relatively small compared with the size of the component in the conventional tape feeder to exert little influence on mounting accuracy with which the components are mounted on the substrate; however, because a downsizing of components and reduction in distance between components on a substrate (conversion into fine pitch) have proceeded recently, there is a case where a defective substrate is manufactured because such an adsorption deviation exerts a large influence on mounting accuracy of the substrate even when the adsorption deviation is of the same degree.

As a method for solving this kind of problem, it can be considered that the size (diameter) of each of the projections provided on the outer perimeter of the sprocket at the height where each of the projections is engaged with each of the feed holes of the tape member is increased overall to create no clearance between the projections and the feed holes by bringing the entire surfaces around the projections into close contact with inner rims of the feed holes of the tape member; however, in this case, the projections become hard to be pulled out of the feed holes after the projections retract the tape member, so that the tape member is waved vertically and vibrations are generated in the tape member, which could on the contrary reduce supply accuracy with which the components are supplied.

Thus, an object of the present invention is to provide a tape feeder, a component mounting apparatus, and a component mounting method that are capable of supplying components to a component ejection slot with precision.

Means for Solving the Problems

A tape feeder of the present invention is a tape feeder that makes a tape member including a plurality of component storage units that are aligned at regular intervals and a plurality of feed holes that are aligned at regular intervals in parallel with the alignment of the component storage units proceed, and supplies components that are housed in each of the component storage units of the tape member to a predetermined component ejection slot, the tape feeder including: a feeder main body including a tape passage that is a passage of the tape member; a sprocket that is provided rotatable under the tape member that passes inside the tape passage of the feeder main body, and includes a number of projections on an outer perimeter; and sprocket driving means for moving each of the projections provided on the outer perimeter of the sprocket on a circular orbit having a rotation axis of the sprocket as its center by drivingly rotating the sprocket intermittently, inserting each of the projections from beneath into each of the feed holes of the tape member that passes through the tape passage of the feeder main body to engage each of the projections with each of the feed holes before and after each of the projections passes through one region on the circular orbit, and making the tape member proceed in a manner that each of the projections leaves the tape member for the beneath of the feed holes after retracting the tape member, wherein a size of each of the projections provided on the outer perimeter of the sprocket in a proceeding direction of the tape member at a height where each of the projections is engaged with each of the feed holes of the tape member is larger than a diameter of each of the feed holes of the tape member, and a size of each of the projections in a direction perpendicular to the proceeding direction of the tape member at a height where each of the projections is engaged with each of the feed holes of the tape member is smaller than the diameter of each of the feed holes of the tape member.

The tape feeder of the present invention is configured that each of the projections provided on the outer perimeter of the sprocket has a cross section that is cut in a plane parallel to the tape member at a position where each of the projections is engaged with each of the feed holes of the tape member, the cross section including a pair of arc shaped portions that are opposed to the proceeding direction of the tape member, and a pair of parallel straight-line portions that are opposed to a direction of the rotation axis of the sprocket.

A component mounting apparatus of the present invention includes: a substrate positioning unit arranged to perform positioning of a substrate; a tape feeder that is arranged to make a tape member including: a plurality of component storage units that are aligned at regular intervals; and a plurality of feed holes that are aligned at regular intervals in parallel with the alignment of the component storage units, proceed, and to supply components that are housed in each of the component storage units of the tape member to a predetermined component ejection slot; and a mounting head arranged to pick up the components that are supplied to the predetermined component ejection slot of the tape feeder and to mount the components on the substrate of which positioning is performed by the substrate positioning unit, wherein the tape feeder includes a feeder main body including a tape passage that is a passage of the tape member, a sprocket that is provided rotatable under the tape member that passes inside the tape passage of the feeder main body, and includes a number of projections on an outer perimeter, and sprocket driving means for moving each of the projections provided on the outer perimeter of the sprocket on a circular orbit having a rotation axis of the sprocket as its center by drivingly rotating the sprocket intermittently, inserting each of the projections from beneath into each of the feed holes of the tape member that passes through the tape passage of the feeder main body to engage each of the projections with each of the feed holes before and after each of the projections passes through one region on the circular orbit, and making the tape member proceed in a manner that each of the projections leaves the tape member for the beneath of the feed holes after retracting the tape member, and wherein a size of each of the projections provided on the outer perimeter of the sprocket in a proceeding direction of the tape member at a height where each of the projections is engaged with each of the feed holes of the tape member is larger than a diameter of each of the feed holes of the tape member, and a size of each of the projections in a direction perpendicular to the proceeding direction of the tape member at a height where each of the projections is engaged with each of the feed holes of the tape member is smaller than the diameter of each of the feed holes of the tape member.

A component mounting method of the present invention is a component mounting method by a component mounting apparatus, the component mounting apparatus including: a substrate positioning unit arranged to perform positioning of a substrate; a tape feeder that is arranged to make a tape member including: a plurality of component storage units that are aligned at regular intervals; and a plurality of feed holes that are aligned at regular intervals in parallel with the alignment of the component storage units, proceed, and to supply components that are housed in each of the component storage units of the tape member to a predetermined component ejection slot; and a mounting head arranged to pick up the components that are supplied to the predetermined component ejection slot and to mount the components on the substrate of which positioning is performed by the substrate positioning unit, wherein the tape feeder includes a feeder main body including a tape passage that is a passage of the tape member, a sprocket that is provided rotatable under the tape member that passes inside the tape passage of the feeder main body, and includes a number of projections on an outer perimeter, and sprocket driving means for moving each of the projections provided on the outer perimeter of the sprocket on a circular orbit having an rotation axis of the sprocket as its center by drivingly rotating the sprocket intermittently, inserting each of the projections from beneath into each the feed holes of the tape member that passes through the tape passage of the feeder main body to engage each of the projections with each of the feed holes before and after each of the projections passes through one region on the circular orbit, and making the tape member proceed in a manner that each of the projections leaves the tape member for the beneath of the feed holes after retracting the tape member, and wherein a size of each of the projections provided on the outer perimeter of the sprocket in a proceeding direction of the tape member at a height where each of the projections is engaged with each of the feed holes of the tape member is larger than a diameter of each of the feed holes of the tape member, and a size of each of the projections in a direction perpendicular to the proceeding direction of the tape member at a height where each of the projections is engaged with each of the feed holes of the tape member is smaller than the diameter of each of the feed holes of the tape member, the component mounting method including the steps of: performing positioning of the substrate by the substrate positioning unit; supplying the components to the component ejection slot by the tape feeder; and picking up the components that are supplied by the tape feeder with use of the mounting head to mount the components on the substrate of which positioning is performed.

Advantageous Effects of the Invention

In the present invention, because the size of each of the projections provided on the outer perimeter of the sprocket in the proceeding direction of the tape member at the height where each of the projections is engaged with each of the feed holes of the tape member is larger than the diameter of each of the feed holes of the tape member, and the size of each of the projections in the direction perpendicular to the proceeding direction of the tape member at the height where each of the projections is engaged with each of the feed holes of the tape member is smaller than the diameter of each of the feed holes of the tape member, which brings the projections that are inserted into from beneath to be engaged with the feed holes into close contact with inner rims of the feed holes in the proceeding direction of the tape member, the components can be supplied to the component ejection slot with precision. It is to be noted that not the entire surfaces around the projections are brought into close contact with the inner rims of the feed holes, so that the projections that have finished retracting the tape member can be smoothly pulled out of the feed holes, and the tape member is not waved vertically, and no vibrations of the tape member hinder the components from being supplied to the component ejection slot with precision.

MODE FOR CARRYING OUT THE INVENTION

Figure 1:
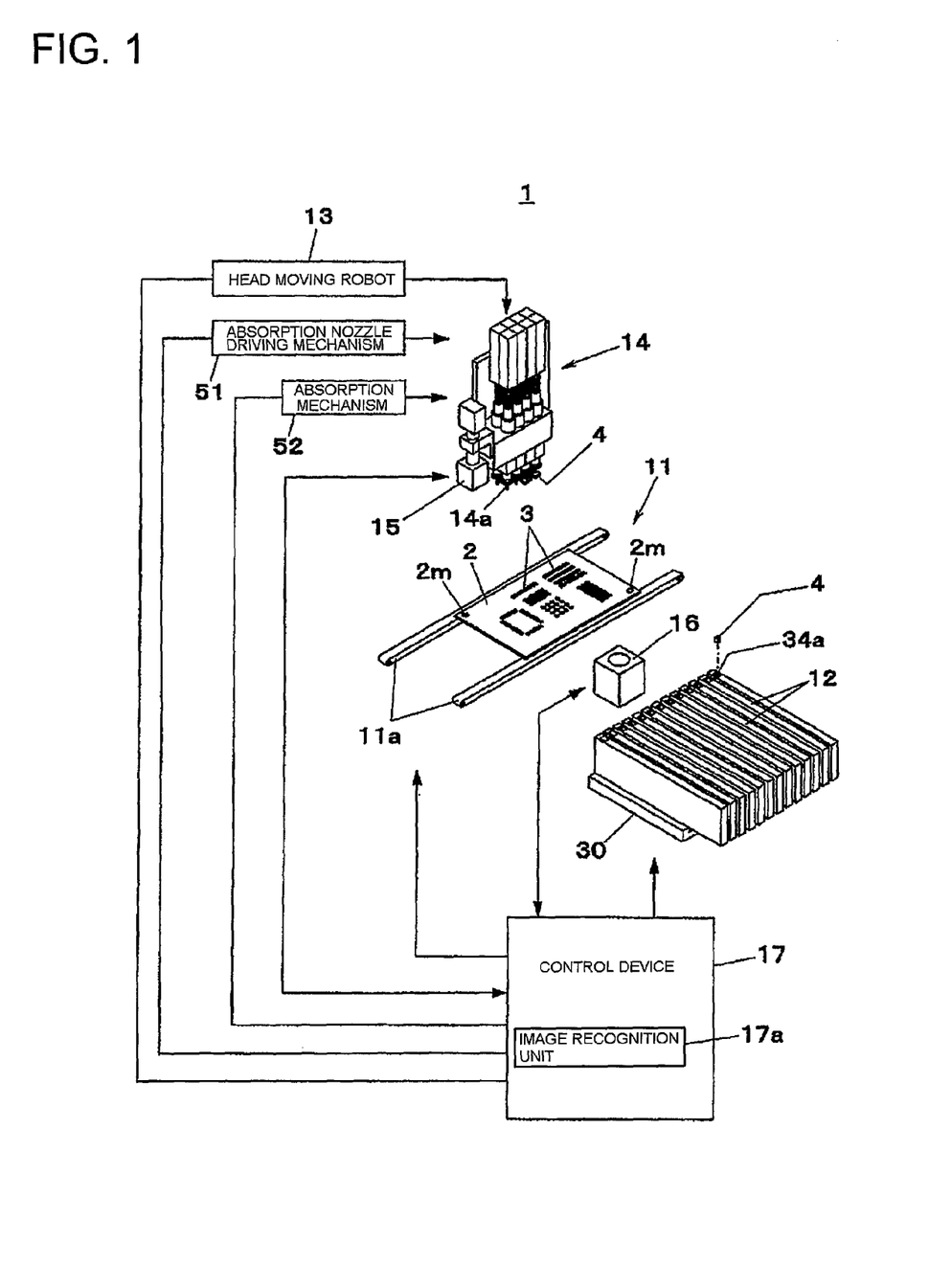
FIG. 1 is a view of a component mounting apparatus according to one embodiment of the present invention showing a configuration of the component mounting apparatus.

Hereinafter, a description of an embodiment of the present invention will be provided with reference to drawings. In FIG. 1, a component mounting apparatus 1 is an apparatus that repeatedly performs a series of operations consisting of feeding to perform positioning of a substrate 2 conveyed from an apparatus that is disposed on a side of an upstream process (e.g., a solder printing machine and another component mounting apparatus) and is not shown in the drawings, mounting components (electronic components) 4 on an electrode unit 3 on the substrate 2 of which positioning is performed, and ejecting the substrate 2 on which the components 4 are mounted to an apparatus that is disposed on a side of a downstream process (e.g., another component mounting apparatus, an inspection machine, a reflow furnace, and the like).

In FIG. 1, the component mounting apparatus 1 includes a conveyer mechanism 11 that consists of a pair of belt conveyers 11a provided on abase that is not shown in the drawing, a plurality of tape feeders 12 as a component supply unit, a mounting head 14 provided movable above the conveyer mechanism 11 with the use of a head moving robot 13 that consists of an XY robot, a substrate camera 15 attached to the mounting head 14, a component camera 16 provided between the conveyer mechanism 11 and the tape feeders 12, and a control device 17 arranged to control the operations of these members.

In FIG. 1, the mounting head 14 includes a plurality of adsorption nozzles 14a extending downward that are provided movable vertically and rotatable about vertical axes. The substrate camera 15 is provided having a field of view oriented downward, and the component camera 16 is provided having a field of view oriented upward.

In FIG. 1, the conveyer mechanism 11 is arranged to feed to perform positioning of the substrate 2 with the use of the pair of belt conveyers 11a.

Each of the tape feeders 12 is arranged to make a tape member 20 (FIG. 2) in which the components 4 are housed proceed, and to supply the components 4 to a predetermined position (a component ejection slot 34a to be described later. FIG. 1).

Figure 2:
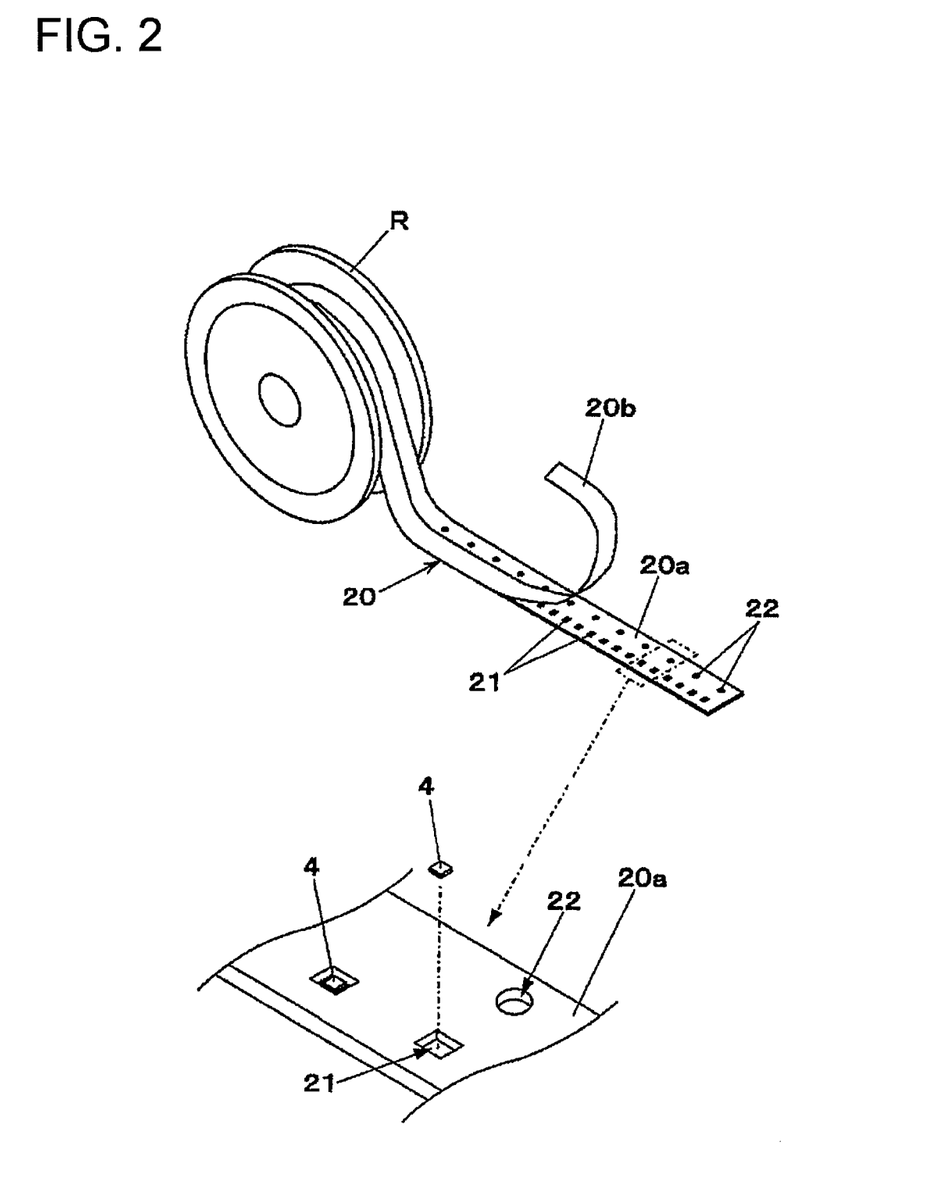
FIG. 2 is a perspective view of a tape member according to the embodiment of the present invention.

As shown in FIG. 2, the tape member 20 is supplied to the tape feeder 12 in the state of being wound on a reel R. The tape member 20 includes a number of component storage units 21 that are aligned at regular intervals in a longitudinal direction, and a number of feed holes 22 that are aligned at regular intervals in parallel with the alignment of the component storage units 21, and the components 4 are housed in each of the component storage units 21. The tape member 20 includes a base tape 20a in which the component storage units 21 and the feed holes 22 are formed, and a transparent top tape 20b that is stuck on the base tape 20a to prevent the components 4 housed in the component storage units 21 from dropping off the base tape 20a. The tape member 20 is supplied in the state of being wound on the reel R.

Figure 3:
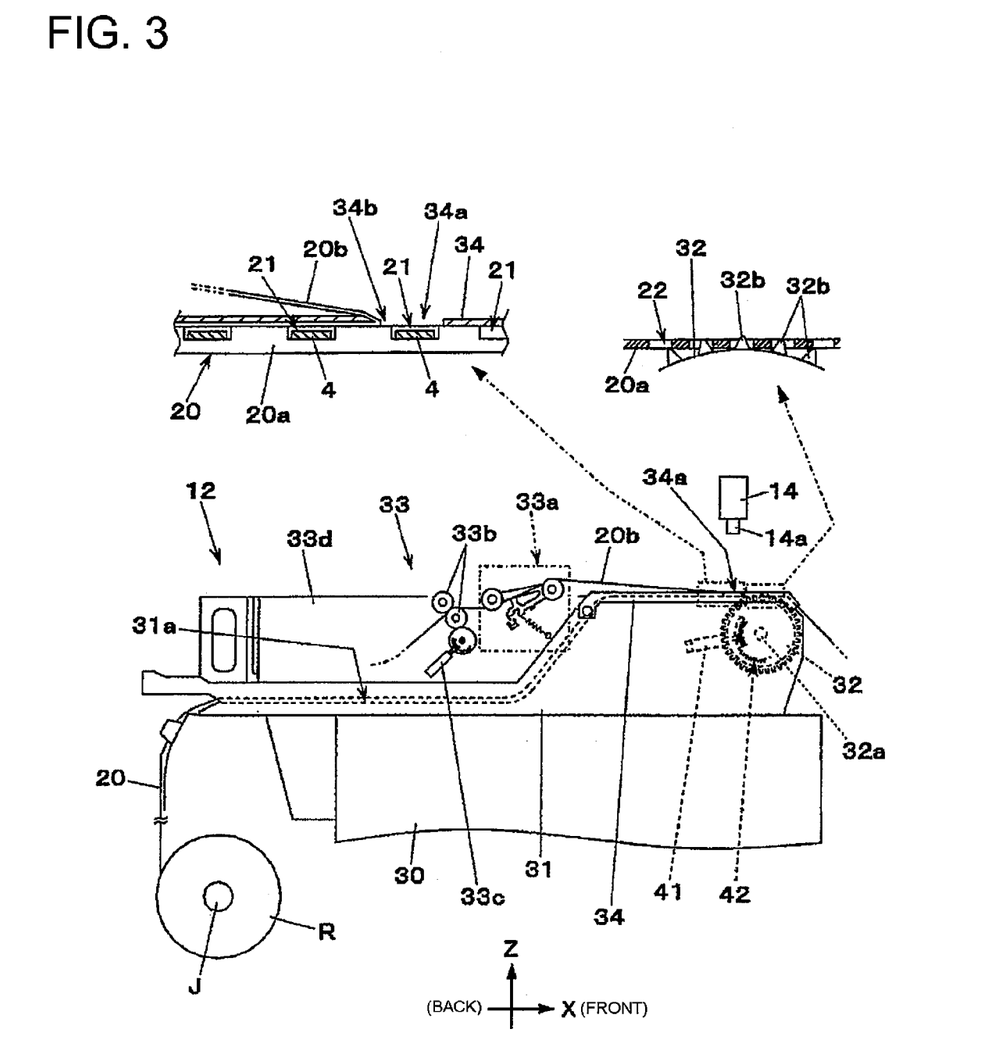
FIG. 3 is a side view of a tape feeder according to the embodiment of the present invention.

In FIG. 3, the tape feeder 12 consists of a feeder main body 31 that is attached removable to a feeder base 30 (see also FIG. 1) provided on a base, a sprocket 32 provided inside the feeder main body 31, a top tape recovery unit 33, and the like. Hereinafter, a direction within a horizontal plane in which the feeder main body 31 extends in the state of being attached to the feeder base 30 is defined as a front-back direction (an X-axis direction) of the tape feeder 12, and a direction within a horizontal plane that is perpendicular to the front-back direction of the tape feeder 12 is defined as a lateral direction (a Y-axis direction) of the tape feeder 12. In addition, a vertical direction of the tape feeder 12 is defined as a Z-axis direction.

In FIG. 3, the reel R on which the tape member 20 is wound is held rotatable by a reel holding axis J that is provided at a position posterior to and outside of the feeder main body 31, and the tape member 20 that is unreeled from the reel R extends forward inside a tape passage 31a that is a passage of the tape member 20 that is provided inside the feeder main body 31.

Figure 4:
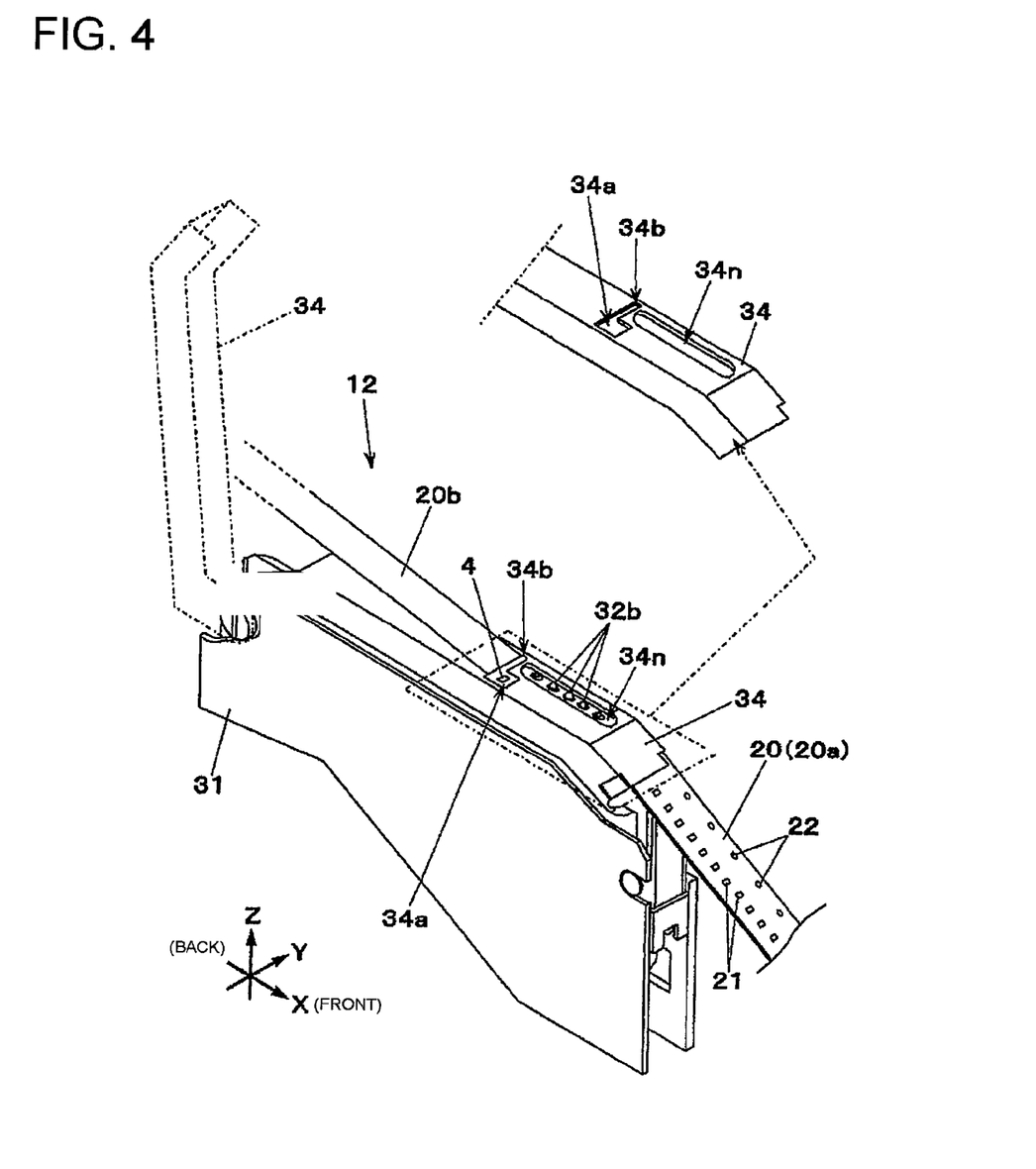
FIG. 4 is a perspective view of the tape feeder according to the embodiment of the present invention.

In FIGS. 3 and 4, the sprocket 32 is provided rotatable about a rotation axis 32a at a position that is a front end portion of the feeder main body 31 and under the tape member 20 that passes inside the tape passage 31a. A number of projections 32b that are aligned at regular intervals are provided on an outer perimeter of the sprocket 32, and the sprocket 32 is intermittently driven about the rotation axis 32a by a sprocket driving motor 41 provided inside the feeder main body 31 via a gear mechanism 42.

Figure 5:
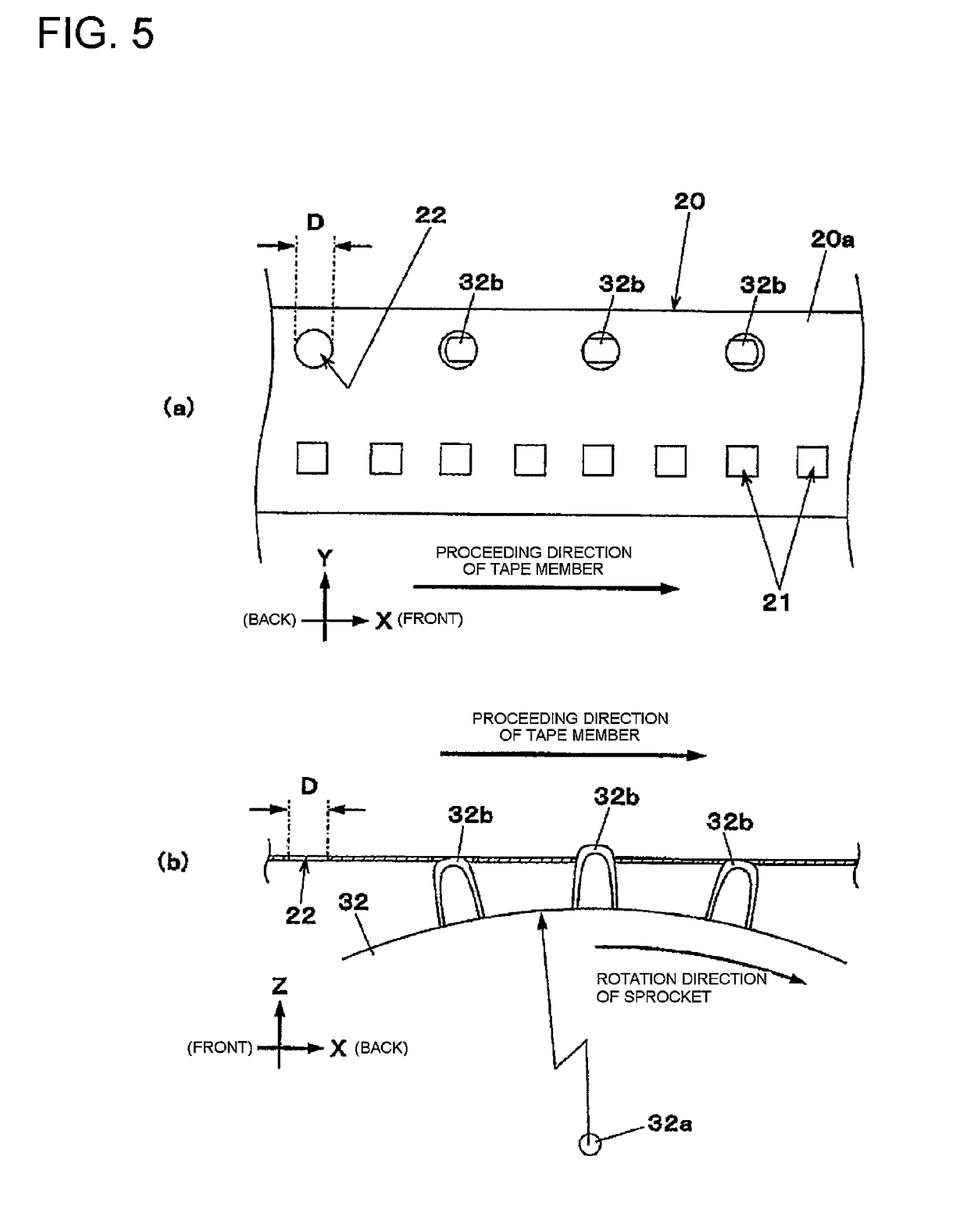
FIG. 5 shows partial views of the tape feeder according to the embodiment of the present invention, in which section (a) is a partial plan view of the tape feeder, and section (b) is a partial side view of the tape feeder.
Figure 6:
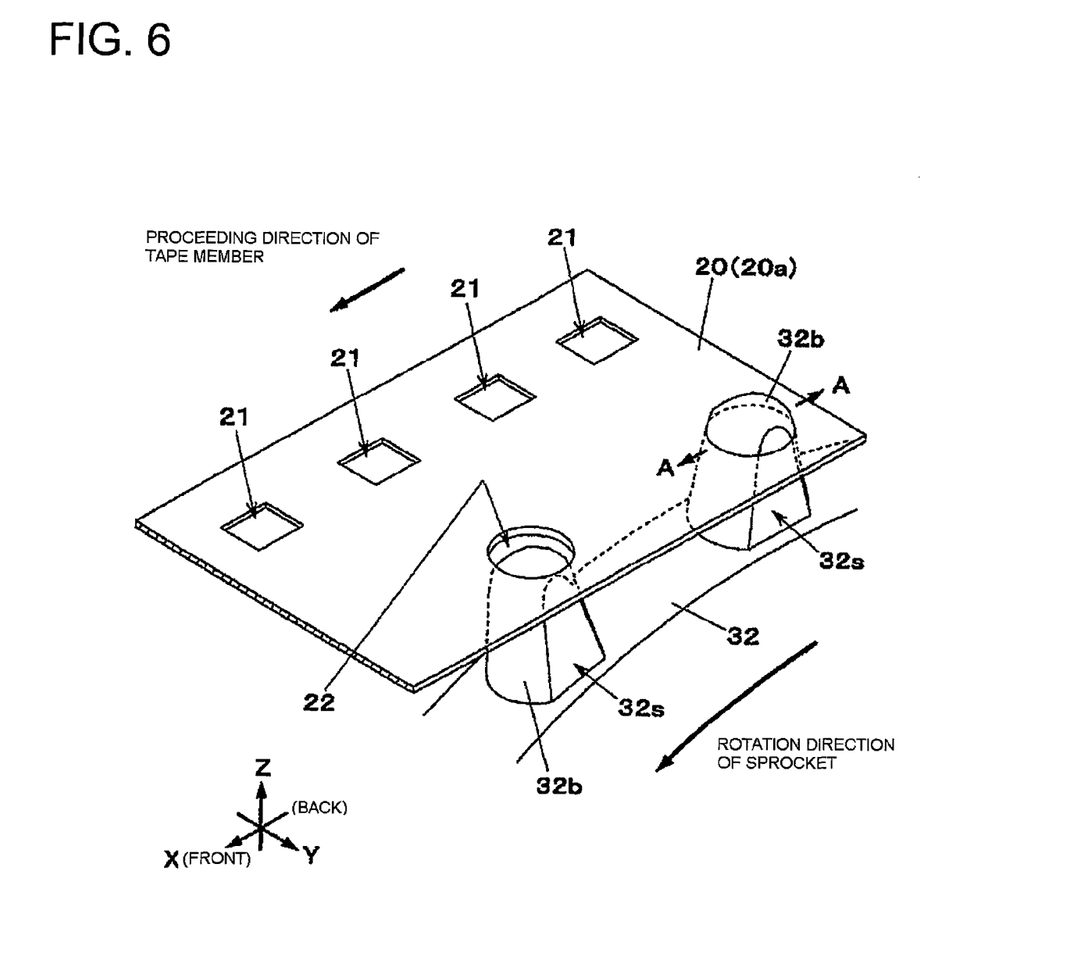
FIG. 6 is a partial perspective view of the tape feeder according to the embodiment of the present invention.

When the sprocket driving motor 41 drivingly rotates the sprocket 32 intermittently about the rotation axis 32a, each of the projections 32b provided on the outer perimeter of the sprocket 32 moves on a circular orbit having the rotation axis 32a of the sprocket 32 as its center, and each of the projections 32b is inserted into from beneath to be engaged with each of the feed holes 22 of the tape member 20 that passes through the tape passage 31a of the feeder main body 31 before and after passing through one region on the circular orbit (here, a region at an upper end portion of the circular orbit) (see the enlarged view in FIG. 3, and FIG. 4), and makes the tape member 20 proceed in a manner that each of the projections 32b leaves for the beneath of the feed holes 22 after retracting the tape member 20 to the front of the tape feeder 12 (see section (a) and section (b) of FIG. 5 and FIG. 6).

That is, in the present embodiment, the sprocket driving motor 41 functions as sprocket driving means for moving each of the projections 32b provided on the outer perimeter of the sprocket 32 on the circular orbit having the rotation axis 32a of the sprocket 32 as its center by drivingly rotating the sprocket 32 intermittently, inserting each of the projections 32b from beneath into each of the feed holes 22 of the tape member 20 that passes through the tape passage 31a of the feeder main body 31 to engage each of the projections 32b with each of the feed holes 22 before and after each of the projections 32b passes through the one region on the circular orbit, and making the tape member 20 proceed in a manner that each of the projections 32b leaves for the beneath of the feed holes after retracting the tape member 20.

In FIGS. 3 and 4, the feeder main body 31 includes a tape presser member 34 that consists of a long member of which a tape presser has a cross-sectional shape of the letter "U". The tape presser member 34 is provided swingable vertically in the state of extending in the front-back direction (the X-axis direction) along the feeder main body 31 (see the tape presser member 34 indicated with the alternate long and short dash line in FIG. 4), and includes the component ejection slot 34a arranged to take out the component 4 from the component storage unit 21 of the tape member 20 (see also FIG. 1), and a top tape drawing slot 34b arranged to draw the top tape 20b upward that is stripped off from the base tape 20a. The tape presser member 34 presses a portion of the tape member 20 that passes inside the tape passage 31a of the feeder main body 31 from above, and holds the tape member 20 slidably between the tape presser member 34 and the tape passage 31a.

In FIG. 4, an observation window 34n is provided at a position in front of the component ejection slot 34a of the tape presser member 34. The observation window 34n is disposed immediately on a position where each of the projections 32b of the sprocket 32 is engaged with each of the feed holes 22 of the tape member 20 in a state where the tape presser member 34 presses the tape member 20 from above.

As described above, when the operation of feeding the tape member 20 by the intermittent rotation operation of the sprocket 32 is performed, and the tape member 20 intermittently proceeds inside the tape passage 31a of the feeder main body 31, each of the component storage units 21 of the tape member 20 is disposed at regular time intervals at a position beneath the component ejection slot 34a of the tape presser member 34, and the components 4 are supplied at regular time intervals to the component ejection slot 34a. It is to be noted that before each of the component storage units 21 reaches the component ejection slot 34a of the tape presser member 34, the top tape 20b is stripped off from the base tape 20a to be drawn to an upper surface side of the tape presser member 34, so that when each of the component storage units 21 reaches the component ejection slot 34a of the tape presser member 34, each of the components 4 is brought into the state of being taken out from each of the component storage units 21.

In FIG. 3, the top tape 20b that is stripped off from the base tape 20a to be drawn upward from the top tape drawing slot 34b of the tape presser member 34 is sent to the top tape recovery unit 33. The top tape recovery unit 33 includes a tension providing mechanism 33a, a pair of recovery rollers 33b, a recovery roller driving motor 33c that is a driving unit for the recovery rollers 33b, and a recovery box 33d, and sandwiches to draw the top tape 20b that is in the state of being provided with an appropriate tension by the tension providing mechanism 33a with the use of the the pair or recovery rollers 33b that are driven by the recovery roller driving motor 33c, and houses to recover the top tape 20b in the recovery box 33d.

Figure 7:
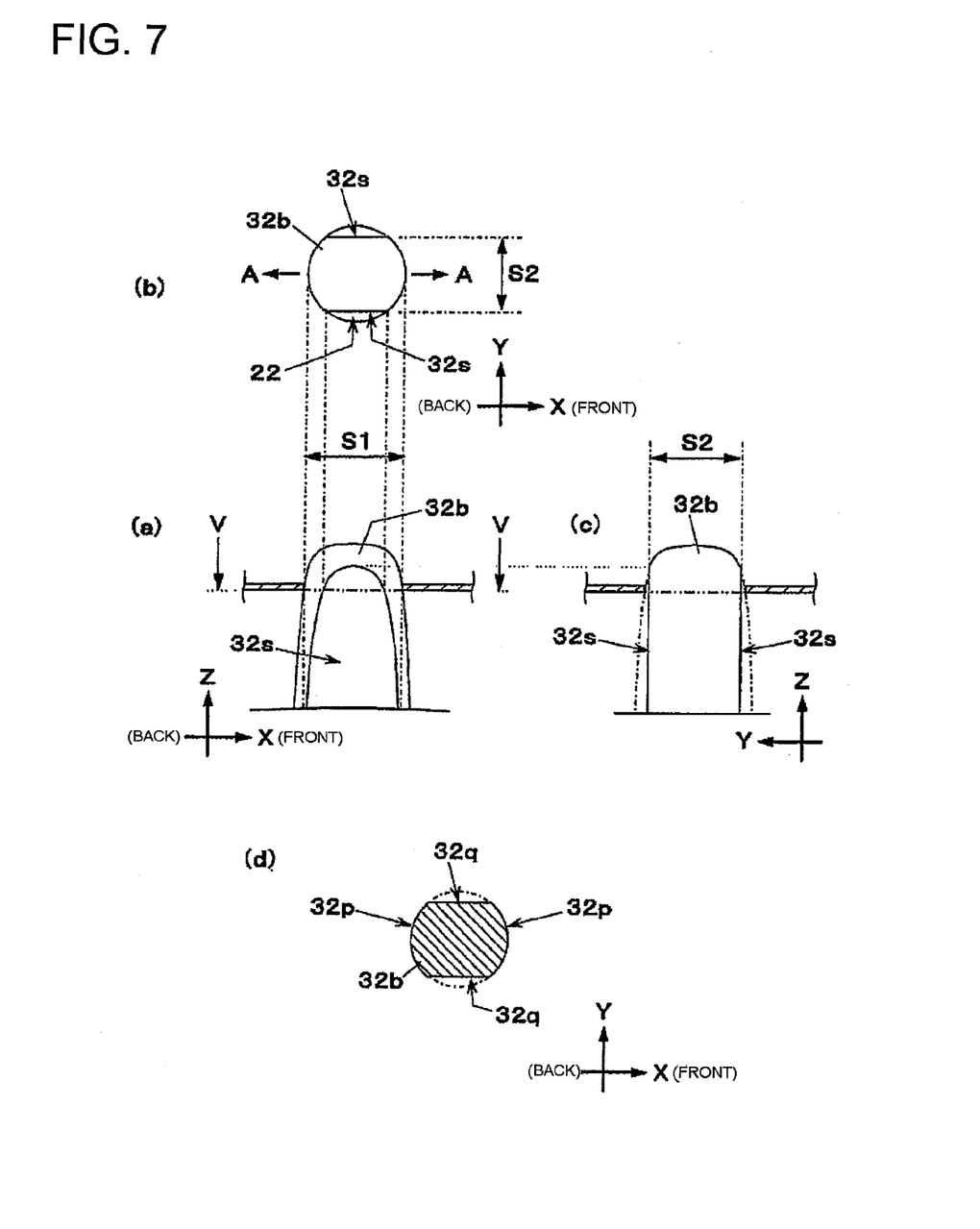
FIG. 7 shows views of a projection of a sprocket that the tape feeder according to the embodiment of the present invention includes, in which section (a) is a side view, section (b) is a plan view, section (c) is a front view, and section (d) is a cross-sectional view of the projection.

Section (a), (b), and (c) of FIG. 7 are three-side views of the projection 32b that is inserted into from beneath to be engaged with the feed hole 22 of the tape member 20, and section (d) of FIG. 7 is a cross-sectional view seen from the arrows V-V of section (a) of FIG. 7. Each of the projections 32b provided on the outer perimeter of the sprocket 32 has as a whole the shape of spreading toward the bottom in a direction of the rotation axis 32a of the sprocket 32 (section (b) of FIG. 5 and FIG. 6), and as shown in section (a), section (b), and section (c) of FIG. 7, planes 32s that are parallel to a rotational plane (an XZ plane) of the sprocket 32 are formed on both sides of the shape spreading toward the bottom of the projection 32b (see also FIG. 6). Thus, the projection 32b has a cross section that is cut in a plane parallel to the tape member 20 at a position where the projection 32b is engaged with the feed hole 22 of the tape member 20 (section (d) of FIG. 7), the cross section including a pair of arc shaped portions (arc shaped portions each of which is in the form of a segment of a circle) 32p that are opposed to the proceeding direction of the tape member 20 (the X-axis direction), and a pair of parallel straight-line portions 32q that are opposed to the direction of the rotation axis 32a of the sprocket 32.

Here, a size S1 of each of the projections 32b provided on the outer perimeter of the sprocket 32 in the proceeding direction of the tape member 20 (the X-axis direction) at a height where each of the projections 32b is engaged with each of the feed holes 22 of the tape member 20 (section (a) and (b) of FIG. 7) is larger than a diameter D of each of the feed holes 22 of the tape member 20 (section and (b) of FIG. 5), and a size S2 of each of the projections 32b in a direction perpendicular to the proceeding direction of the tape member 20 (the Y-axis direction) at a height where each of the projections 32b is engaged with each of the feed holes 22 of the tape member 20 (section (c) of FIG. 7) is smaller than the diameter D of each of the feed holes 22 of the tape member 20, so that when passing through the region at the upper end portion of the circular orbit having the rotation axis 32a of the sprocket 32 as its center, each of the projections 32b provided on the outer perimeter of the sprocket 32 gets into each of the feed holes 22 from beneath while pushing to open an inner rim of each of the feed holes 22 in the proceeding direction of the tape member 20 (the arrows A1 shown in FIG. 6 and section (b) of FIG. 7), and retracts the tape member 20 in that state. Thus, the projections 32b that are inserted into from beneath to be engaged with the feed holes 22 are brought into close contact with the inner rims of the feed holes 22 in the proceeding direction of the tape member 20, and the position of the tape member 20 (to be specific, the positions of the component storage units 21) is determined with precision by the positions of the projections 32b of the sprocket 32 (that is, a rotation angle of the sprocket 32).

In FIG. 1, the operation of conveying and positioning the substrate 2 with the use of the conveyer mechanism 11 is performed by the control device 17's controlling the operation of the pair of belt conveyers 11a that constitute the conveyer mechanism 11.

In FIG. 1, the operation of supplying the components 4 to the component ejection slot 34a with the use of each of the tape feeders 12 is performed by the control device 17's controlling the operation of the above-described sprocket driving motor 41 and the operation of the above-described recovery roller driving motor 33c.

In FIG. 1, the operation of moving the mounting head 14 is performed by the control device 17's controlling the operation of the above-described head moving robot 13. In addition, in FIG. 1, the operation of lifting and lowering, and rotating the adsorption nozzles 14a provided to the mounting head 14 about a vertical axis with respect to the mounting head 14 is performed by the control device 17's controlling the operation of a nozzle driving mechanism 51 (FIG. 1) consisting of an actuator and the like that are not shown in the drawing, and the operation of absorbing (picking up) the components 4 and releasing absorption of the components 4 (mounting the components 4 on the substrate 2) with the use of the adsorption nozzles 14a is performed by the control device 17's controlling the operation of an absorption mechanism 52 (FIG. 1) consisting of an actuator and the like that are not shown in the drawing to supply a vacuum pressure to the inside of the adsorption nozzles 14a, and to release supply of a vacuum pressure.

In FIG. 1, the movement of the substrate camera 15 is performed by the control device 17's controlling the operation of the head moving robot 13, and the control of image capturing operation with the use of the substrate camera 15 is performed by the control device 17. Image data obtained by the image capturing operation of the substrate camera 15 is input into the control device 17, and subjected to image recognition processing in an image recognition unit 17a that the control device 17 includes.

In FIG. 1, the control of image capturing operation with the use of the component camera 15 is performed by the control device 17, and image data obtained by the image capturing operation of the component camera 16 is input into the control device 17, and subjected to image recognition processing in the image recognition unit 17a.

Figure 8:
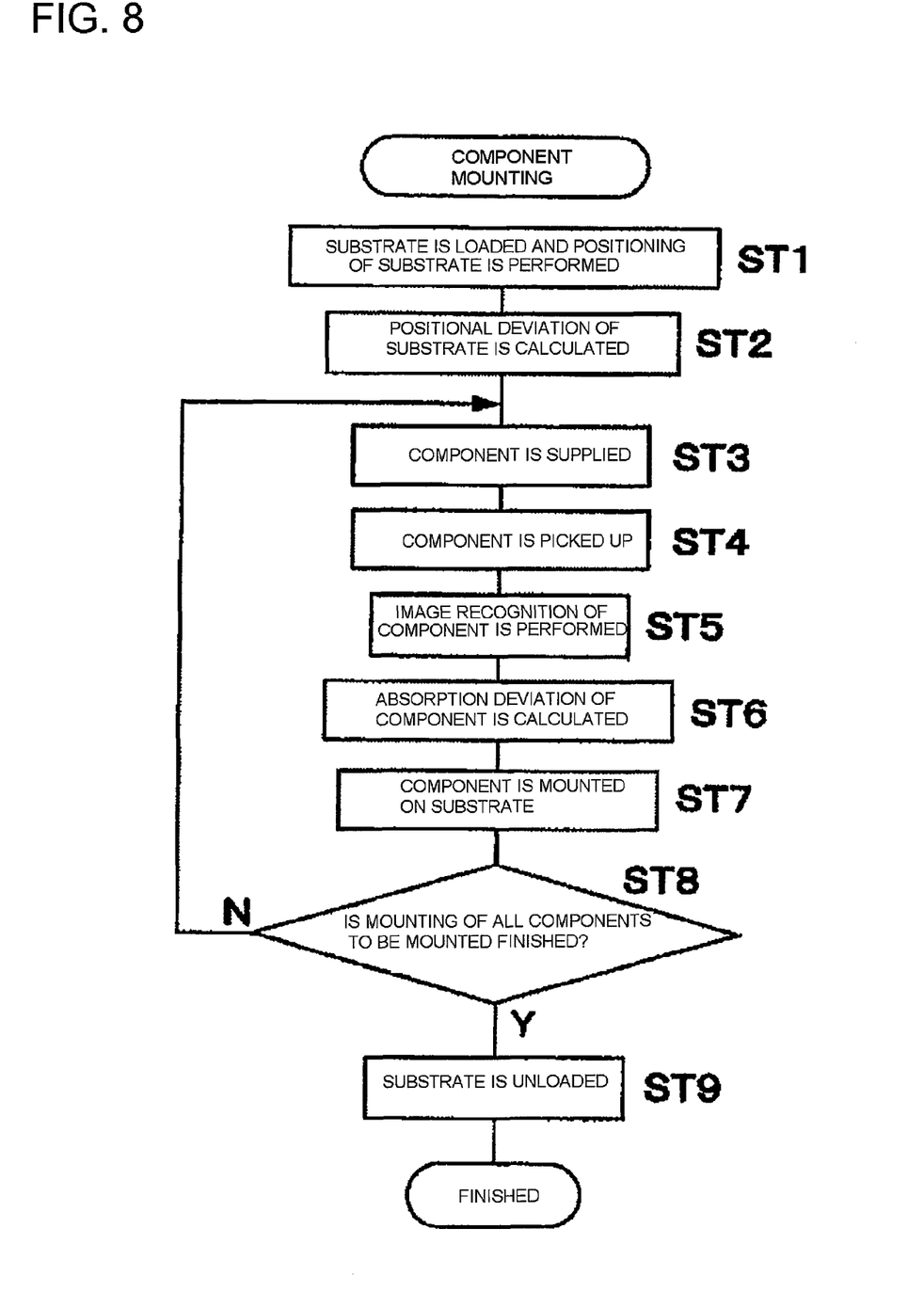
FIG. 8 is a flow chart showing a procedure for carrying out a component mounting method using the component mounting apparatus according to the embodiment of the present invention.

In order to carry out a component mounting operation (a component mounting method) to mount the components 4 on the electrode unit 3 on the substrate 2 by the component mounting apparatus 1 having the configuration as described above, the control device 17 first actuates the conveyer mechanism 11, receives the substrate 2 that is conveyed from an apparatus that is disposed on a side of an upstream process (e.g., a solder printing machine) of the component mounting apparatus 1, loads the substrate 2 into the component mounting apparatus 1, and performs positioning of the substrate 2 at a predetermined work position (the position shown in FIG. 1) (the step ST1 shown in FIG. 8).

As described above, in the present embodiment, the conveyer mechanism 11 corresponds to a substrate positioning unit that performs positioning of the substrate 2, and the step ST1 corresponds to a step of performing positioning of the substrate 2 with the use of the conveyer mechanism 11 that is the substrate positioning unit.

After the positioning of the substrate 2 is performed, the control device 17 moves the mounting head 14 to move the substrate camera 15 above the substrate 2, controls the substrate camera 15 to capture an image of a pair of substrate marks 2m (FIG. 1) on the substrate 2, and performs image recognition. Then, by comparing the obtained position of the pair of substrate marks 2m with a reference position that is predetermined, a positional deviation of the substrate 2 from the reference position is calculated (the step ST2 shown in FIG. 8).

After calculating the positional deviation of the substrate 2 from the reference position, the control device 17 controls the operation of the tape feeder 12 (to be specific, the operation of the sprocket driving motor 41 and the operation of the recovery roller driving motor 33c) to supply the component 4 to the component ejection slot 34a of the tape feeder 12 (the step ST3 shown in FIG. 8), and controls the mounting head 14 to be positioned above the tape feeder 12 (FIG. 3) to pick up (absorb) the component 4 that is supplied to the component ejection slot 34a of the tape feeder 12 (the step ST4 shown in FIG. 8).

After controlling the adsorption nozzles 14a to pick up the component 4, the control unit 17 controls the mounting head 14 to move such that the component 4 passes above the component camera 16, controls the component camera 16 to capture an image of the component 4 to perform image recognition (the step ST5 shown in FIG. 8), and calculates a positional deviation (an absorption deviation) of the component 4 with respect to the adsorption nozzles 14a (the step ST6 shown In FIG. 8).

After calculating the positional deviation of the component 4 with respect to the adsorption nozzles 14a, the control device 17 controls the mounting head 14 to be positioned above the substrate 2, brings the component 4 that is picked up by the adsorption nozzles 14a into contact with the electrode unit 3 on the substrate 2 (solder is printed on the electrode unit 3 by the solder printing machine disposed on the side of the upstream process of the component mounting apparatus 1), releases supply of a vacuum pressure to the adsorption nozzles 14a, and mounts the component 4 on the substrate 2 (the step ST7 shown in FIG. 8).

As described above, in the present embodiment, the mounting head 14 picks up to mount the component 4 that is supplied to the component ejection slot 34a of the tape feeder 12 on the substrate 2 of which positioning is performed by the conveyer mechanism 11 that is the substrate positioning unit. In addition, in the present embodiment, the step ST3 corresponds to a step of supplying the component 4 to the component ejection slot 34a with the use of the tape feeder 12, and the step ST4 to the step ST7 correspond to steps of picking up the component 4 that is supplied by the tape feeder 12 with the use of the mounting head 14 to mount the component 4 on the substrate 2 of which positioning is performed.

At this point, when mounting the component 4 on the substrate 2, the control device 17 performs position correction (including rotation correction) of the adsorption nozzles 14a with respect to the substrate 2 such that the positional deviation of the substrate 2 calculated in the step ST2 and the absorption deviation of the component 4 calculated in the step ST6 are corrected.

After mounting the component 4 on the substrate 2 in the above-described step ST7, the control device 17 makes a judgment on whether or not mounting of all the components 4 that should be mounted on the substrate 2 is finished (the step ST8 shown in FIG. 8). Then, as a result, when mounting of all the components 4 that should be mounted on the substrate 2 is not finished, the control device 17 returns to the step ST4 to pick up a next component 4 with the use of the adsorption nozzles 14a, and when mounting of all the components 4 that should be mounted on the substrate 2 is finished, the control device 17 actuates the conveyer mechanism 11 to unload the substrate 2 from the component mounting apparatus 1 (the step ST9 shown in FIG. 8).

As explained in the above description, the tape feeder 12 according to the present embodiment has the configuration that the size S1 of each of the projections 32b provided on the outer perimeter of the sprocket 32 in the proceeding direction of the tape member 20 at the height where each of the projections 32b is engaged with each of the feed holes 22 of the tape member 20 is larger than the diameter D of each of the feed holes 22 of the tape member 20, and the size S2 of each of the projections 32b in the direction perpendicular to the proceeding direction of the tape member 20 at the height where each of the projections 32b is engaged with each of the feed holes 22 of the tape member 20 is smaller than the diameter of each of the feed holes 22 of the tape member 20, so that the projections 32b that are inserted into from beneath to be engaged with the feed holes 22 are brought into close contact with the inner rims of the feed holes 22 in the proceeding direction of the tape member 20, which allows the positions of the component storage units 21 of the tape member 20 to be controlled with precision. Thus, according to the tape feeder 12 in the present embodiment, the component mounting apparatus 1 including the tape feeder 12, and the component mounting method by the component mounting apparatus 1, the components 4 can be supplied to the component ejection slot 34a with precision.

It is to be noted that not the entire surfaces around the projections 32b are brought into close contact with the inner rims of the feed holes 22, so that the projections 32b that have finished retracting the tape member 20 can be smoothly pulled out of the feed holes 22, and the tape member 20 is not waved vertically, and no vibrations of the tape member 20 hinder the components 4 from being supplied to the component ejection slot 34a with precision.

The present application is based on the Japanese Patent Application filed on Aug. 25, 2011 (No. 2011-183266), and the contents thereof are incorporated herein by reference.

INDUSTRIAL APPLICABILITY

A tape feeder, a component mounting apparatus, and a component mounting method that are capable of supplying components to a component ejection slot with precision are provided.

DESCRIPTION OF REFERENCE NUMERALS AND SIGNS

1 Component mounting apparatus
2 Substrate
4 Component
11 Conveyer mechanism (Substrate positioning unit)
12 Tape feeder
14 Mounting head
20 Tape member
21 Component storage unit
22 Feed hole
31 Feeder main body
31a Tape passage
32 Sprocket
32a Rotation axis
32b Projection
32p Arc shaped portion
32q Straight-line portion
34a Component ejection slot
41 Sprocket driving motor (Sprocket driving means)
S1 Size in a proceeding direction of a tape member
S2 Size in a direction perpendicular to a proceeding direction of a tape member
D Diameter of a feed hole of a tape member

The invention claimed is:

1. A component mounting method by a component mounting apparatus, the component mounting apparatus comprising:
a substrate positioning unit arranged to perform positioning of a substrate;
a tape feeder that is arranged to make a tape member comprising:
a plurality of component storage units that are aligned at regular intervals; and
a plurality of feed holes that are aligned at regular intervals in parallel with the alignment of the component storage units,
wherein the tape feeder moves the tape member to supply components that are housed in each of the component storage units of the tape member to a predetermined component ejection slot; and
a mounting head arranged to pick up the components that are supplied to the predetermined component ejection slot and to mount the components on the substrate of which positioning is performed by the substrate positioning unit,
wherein the tape feeder comprises
a feeder main body comprising a tape passage that is a passage of the tape member,
a sprocket that is provided rotatable under the tape member that passes inside the tape passage of the feeder main body, and comprises a number of projections on an outer perimeter, and
sprocket driving means for moving each of the projections provided on the outer perimeter of the sprocket on a circular orbit having an rotation axis of the sprocket as its center by drivingly rotating the sprocket intermittently, inserting each of the projections from beneath into each of the feed holes of the tape member that passes through the tape passage of the feeder main body to engage each of the projections with each of the feed holes before and after each of the projections passes through one region on the circular orbit, and making the tape member proceed in a manner that each of the projections leaves the tape member for the beneath of the feed holes after retracting the tape member, and
wherein a size of each of the projections provided on the outer perimeter of the sprocket in a proceeding direction of the tape member at a height where each of the projections is engaged with each of the feed holes of the tape member is larger than a diameter of each of the feed holes of the tape member, and a size of each of the projections in a direction perpendicular to the proceeding direction of the tape member at a height where each of the projections is engaged with each of the feed holes of the tape member is smaller than the diameter of each of the feed holes of the tape member, the component mounting method comprising the steps of:
performing positioning of the substrate by the substrate positioning unit;
supplying the components to the component ejection slot by the tape feeder; and
picking up the components that are supplied by the tape feeder with use of the mounting head to mount the components on the substrate of which positioning is performed.

2. The component mounting method according to claim 1 comprising:
wherein each of the projections has a leading arc-shaped surface and a trailing arc-shaped surface and opposite side surfaces, and wherein a longest distance between the leading arc-shaped surface and the trailing arc-shaped surface in the proceeding direction of the tape member at the height where each of the projections is engaged with each of the feed holes of the tape member is larger than the diameter of each of the feed holes of the tape member, and a distance between the opposite side surfaces in the direction perpendicular to the proceeding direction of the tape member at the height where each of the projections is engaged with each of the feed holes of the tape member is smaller than the diameter of each of the feed holes of the tape member.

3. The component mounting method according to claim 2 comprising:
wherein at least one of the entire leading arc-shaped surface and the entire trailing arc-shaped surface is in contact with an inner rim of the feed hole of the tape member when the projection engages with the feed hole, and wherein the entire of the opposite side surfaces are spaced from the inner rim of the feed hole of the tape member when the projection engages with the feed hole.

4. The component mounting method according to claim 1 wherein the size of each of the projections that is larger than the diameter of each of the feed holes of the tape member is aligned parallel with the proceeding direction of the tape member.

\* \* \* \* \*